US006972240B2

(12) United States Patent
Poveda

(10) Patent No.: US 6,972,240 B2
(45) Date of Patent: Dec. 6, 2005

(54) FORMING OF CLOSE THIN TRENCHES

(75) Inventor: Patrick Poveda, Villedomer (FR)

(73) Assignee: STMicroelectronics S.A., (FR)

( * ) Notice: Subject to any disclaimer, the term of this patent is extended or adjusted under 35 U.S.C. 154(b) by 154 days.

(21) Appl. No.: 10/717,286

(22) Filed: Nov. 19, 2003

(65) Prior Publication Data

US 2004/0099925 A1    May 27, 2004

(30) Foreign Application Priority Data

Nov. 19, 2002  (FR) ................................. 02 14460

(51) Int. Cl.⁷ ............................................ H01L 21/76
(52) U.S. Cl. ..................................... 438/424; 438/700
(58) Field of Search ............................ 438/412, 424, 438/700

(56) References Cited

U.S. PATENT DOCUMENTS

| | | | | |
|---|---|---|---|---|
| 4,650,544 A | 3/1987 | Erb et al. ................... 438/387 |
| 5,793,077 A | 8/1998 | Tseng .......................... 257/301 |
| 6,175,144 B1 | 1/2001 | Gardener et al. ........... 257/506 |
| 6,211,039 B1 * | 4/2001 | Noble ......................... 438/412 |
| 6,316,309 B1 | 11/2001 | Holmes ....................... 438/246 |
| 2002/0052092 A1 * | 5/2002 | Lachner ....................... 438/424 |

* cited by examiner

Primary Examiner—David S. Blum
(74) Attorney, Agent, or Firm—Lisa K. Jorgenson; Graybeal Jackson Haley LLP

(57) ABSTRACT

A method for forming narrow trenches in a silicon substrate, comprising the steps of: etching the substrate to form first trenches separated by first silicon ribs; performing a thermal oxidation of the substrate to form a silicon oxide layer around the substrate, to obtain second trenches and second silicon ribs; filling the second trenches with fingers of an etchable material; etching the oxide down to the upper surface of the second ribs while keeping oxide portions between said material fingers and the second ribs; etching away the second silicon ribs and said material fingers; etching the oxide to expose the substrate at the bottom of the oxide portions, while keeping oxide fingers; and etching the substrate between the oxide fingers to form narrow trenches in the substrate.

14 Claims, 3 Drawing Sheets

FORMING OF CLOSE THIN TRENCHES

PRIORITY CLAIM

This application claims priority from French patent application No. 02/14460, filed Nov. 19, 2002, which is incorporated herein by reference.

BACKGROUND OF THE INVENTION

1. Field of the Invention

The present invention relates to the forming of dose thin trenches in a semiconductor substrate.

2. Discussion of the Related Art

The minimum width of a trench and the spacing between trenches conventionally depend on the lithography apparatus used to insolate resists. The more the insolation is accurate, the more possible it is to obtain very narrow trenches after etching.

SUMMARY

When it is not necessarily possible to have a lithography device providing narrow trenches, the described embodiments of the present invention aim at forming trenches having a width smaller than the minimum width normally possible with a given lithography device.

Embodiments of the present invention provide a method for forming narrow trenches in a silicon substrate comprising the steps of etching the substrate to form first trenches separated by first silicon ribs; performing a thermal oxidation of the substrate to form a silicon oxide layer developing inside and outside of the silicon, whereby second trenches narrower than the first trenches and second silicon ribs narrower than the first silicon ribs are obtained; filling the second trenches with fingers of an etchable material; etching the silicon oxide down to the upper surface of the second ribs while keeping silicon oxide portions between said etchable material fingers and the second ribs; etching away the second silicon ribs and said etchable material fingers; etching the silicon oxide for a duration sufficient to expose the substrate at the bottom of the silicon oxide portions, while leaving in place silicon oxide fingers; and anisotropically etching the substrate between the oxide fingers to form narrow trenches in the substrate.

According to an alternative embodiment of the previously-described method, the filling step includes: depositing a layer of an etchable material totally filling the second trenches and covering the silicon oxide layer; and etching said layer of an etchable material for a duration sufficient to leave in place only fingers in the second trenches.

According to an alternative embodiment of the previously-described method, an additional step of etching back of said silicon oxide fingers is provided.

According to an alternative embodiment of the previously-described method, the method further comprises the steps of: depositing a filling layer formed of a material selectively etchable with respect to the substrate, the filling layer totally filling the narrow trenches and covering the substrate ribs separating the narrow trenches; etching the filling layer to expose the substrate ribs, while keeping the material present between ribs; performing a chemical-mechanical polishing of the upper portion of the ribs; and etching back the material remaining between the ribs.

According to an alternative embodiment of the previously-described method, the width and the spacing of the first trenches are identical and the duration of the thermal oxidation of the substrate is provided to obtain substantially identical narrow trenches.

According to an alternative embodiment of the previously-described method, the etchable material used to fill the second trenches is polysilicon.

According to an alternative embodiment of the previously-described method, the second silicon ribs and the etchable material fingers are etched simultaneously.

The foregoing features and advantages of embodiments of the present invention will be discussed in detail in the following non-limiting description of specific embodiments in connection with the accompanying drawings.

DETAILED DESCRIPTION

The following discussion is presented to enable a person skilled in the art to make and use the invention. Various modifications to the embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein.

The drawings are cross-section views of the initial substrate and of the different layers obtained after each of the narrow trench manufacturing steps according to embodiments of the present invention.

Figure 1:
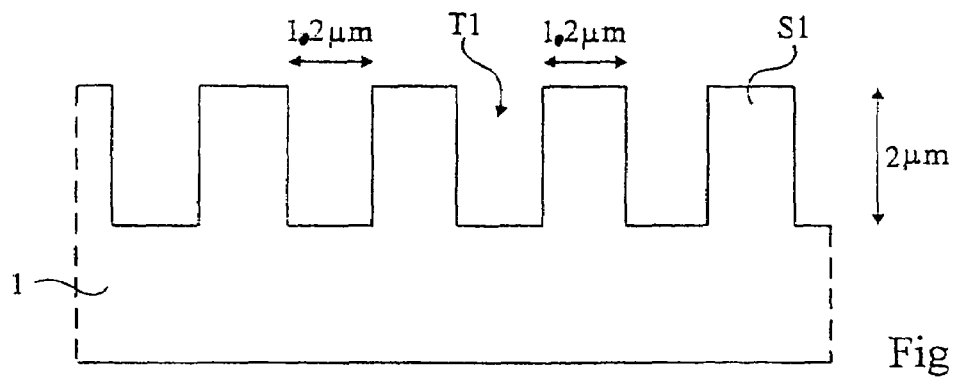
FIGS. 1 to 9 illustrate successive steps of a narrow trench manufacturing method according to an embodiment of the present invention.

FIG. 1 shows a substrate 1 in which are formed trenches T1. These trenches are formed by using a lithography device and a standard etch process enabling at best obtaining patterns having a 1.2-$\mu$m width and distance between of 1.2 $\mu$m. In the illustrated example, trenches T1 having a 2-$\mu$m depth have been formed. Trenches T1 are separated by ribs S1 of the substrate.

Figure 2:
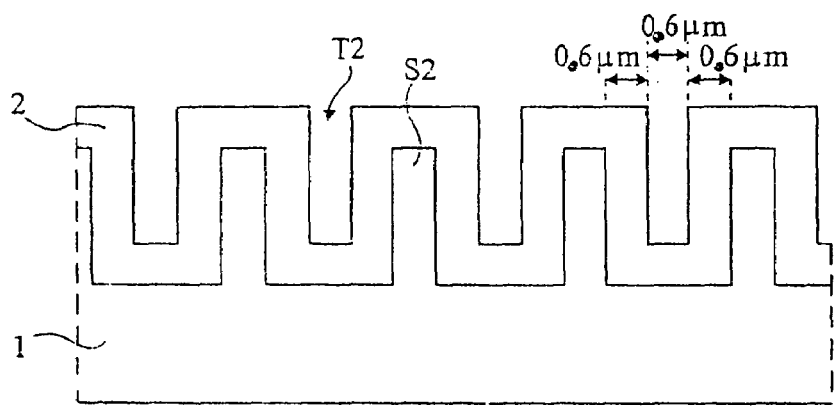

At the next step, illustrated in FIG. 2, a thermal oxidation is performed to form a silicon oxide layer 2 having in this example a 0.6-$\mu$m thickness. Trenches T2 narrower than initial trenches T1 are obtained. The substrate ribs have uniformly shrunk by approximately 0.3 $\mu$m, forming substrate ribs S2 narrower than initial substrate ribs S1. Similarly, the bottom of trenches T1 has deepened by 0.3 $\mu$m. In the end, trenches T2 and ribs S2 all have a width equal to substantially 0.6 $\mu$m and are separated by a silicon oxide layer substantially of a 0.6-$\mu$m width.

Figure 3:
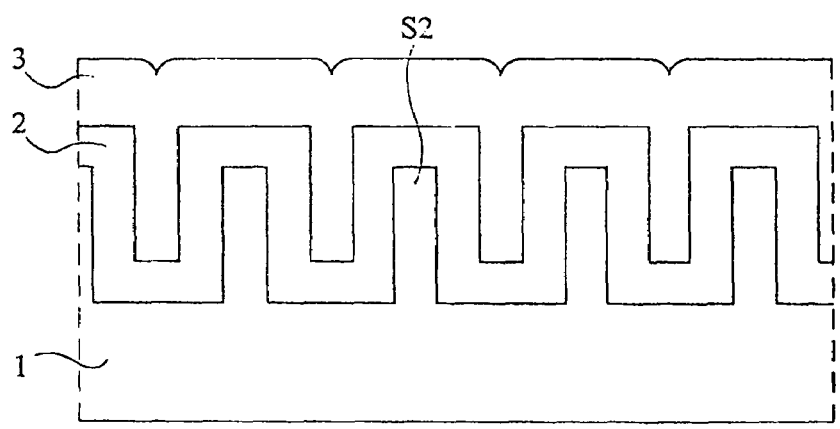

At the next step, illustrated in FIG. 3, a silicon layer 3 is deposited to form, in this example, polysilicon, to totally fill trenches T2 and cover silicon oxide layer 2. The thickness of polysilicon 3 above the ribs of substrate S2 is in this example at least equal to 1.5 $\mu$m.

As an alterative, another material than silicon could be deposited. Preferably, a material that can be etched with a substantially identical speed could be chosen to simplify the part of the method described in relation with FIG. 6.

Figure 4:
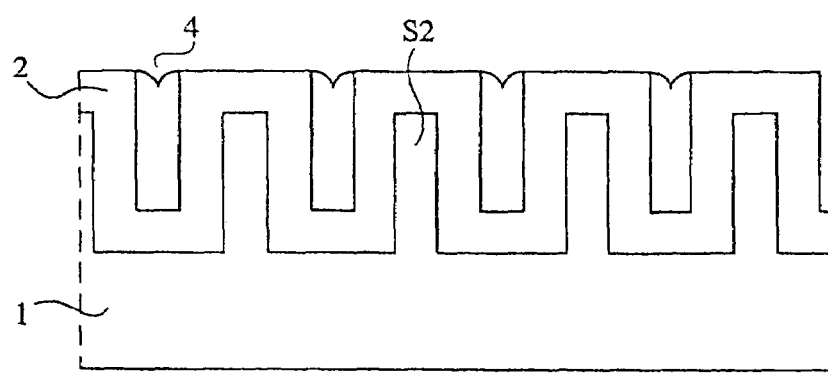

At the next step, illustrated in FIG. 4, polysilicon layer 3 is selectively etched with respect to silicon oxide, to expose silicon oxide 2 covering substrate ribs S2. The etching is then interrupted so that there remain fingers 4 of polysilicon layer 3 in trenches T2.

Figure 5:
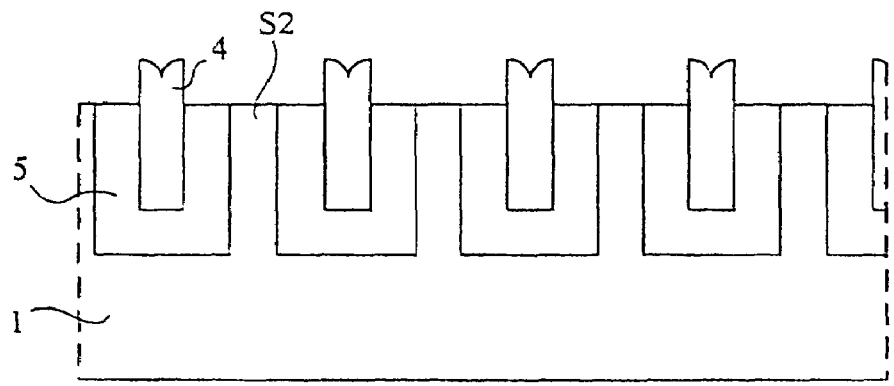

At the next step, illustrated in FIG. 5, silicon oxide layer 2 is etched for a sufficient duration to expose the upper part of ribs S2. The etching is selective to keep polysilicon fingers 4 as well as ribs S2 intact. A structure such as shown in FIG. 5 is then obtained, in which the remaining portions 5 of oxide layer 2 have a U shape separating fingers 4 and ribs S2.

Figure 6:
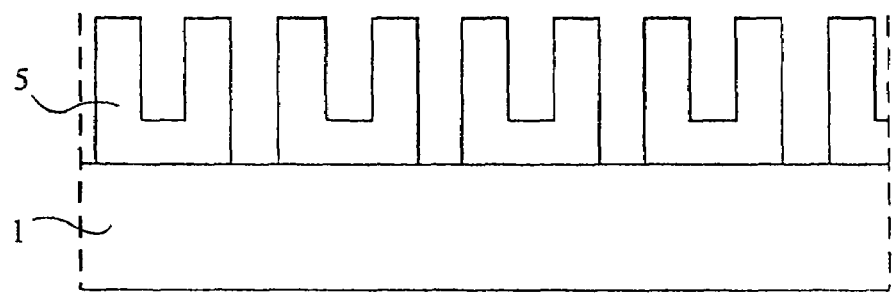

At the next step, illustrated in FIG. 6, the silicon is etched to suppress ribs S2 and polysilicon fingers 4. The etching is selective to keep the remaining portions 5 of oxide layer 2 intact. The etch time is provided to completely remove polysilicon fingers 4 and for the etching to approximately stop at the level of the base of silicon ribs S2.

An additional etch step may possibly be provided in the case where the material deposited in trenches T2 cannot be etched according to the method used to etch ribs S2. The additional etch step will however have to be a selective etching with respect to oxide layer 2.

Figure 7:
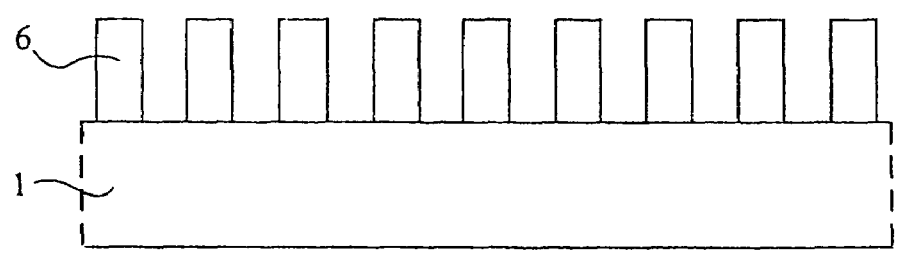

At the next step illustrated in FIG. 7, an anisotropic etching of the silicon oxide is performed in selective fashion with respect to silicon, for a duration enabling exposing substrate 1 at the bottom of the remaining U-shaped silicon oxide portions 5 while leaving silicon oxide fingers 6 in place. In the context of the numerical example given hereabove, the etching time is provided to etch approximately 0.6 $\mu$m of silicon oxide.

Figure 8:
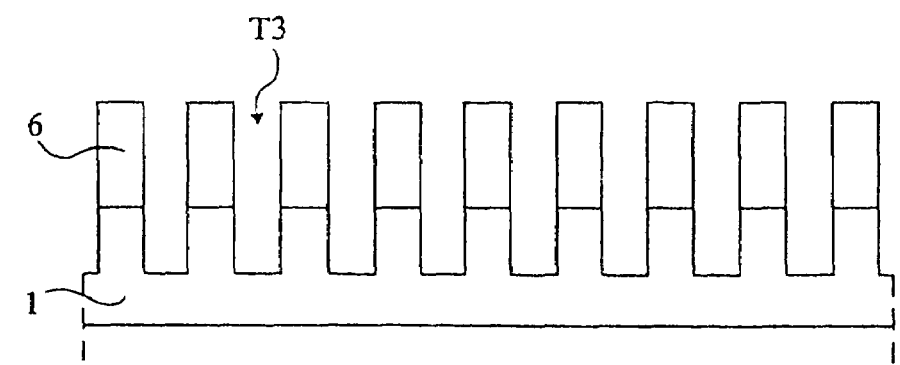

At the next step, illustrated in FIG. 8, an anisotropic etching of the portions of substrate 1 unprotected by silicon oxide fingers 6 is performed.

Figure 9:
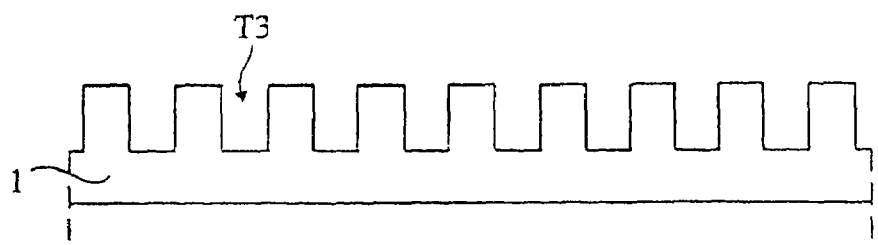

At the next step, illustrated in FIG. 9, silicon oxide fingers 6 are removed.

Narrow trenches T3 having a width of approximately 0.6 $\mu$m separated by ribs S3 also having a width of approximately 0.6 $\mu$m are thus obtained.

Thus, based on a structure of trenches formed with a minimum 1.2-$\mu$m step, it is possible to obtain a structure comprising twice as many trenches with a 0.6-$\mu$m step.

Generally, the method of this embodiment of the present invention enables, based on a trench structure formed with a minimum step corresponding to a given lithography device, to obtain a structure comprising twice as many trenches with a step which is twice as small.

It could further be provided to repeat the described method to obtain twice as many trenches with a 0.3-$\mu$m step and so on.

Figure 10:
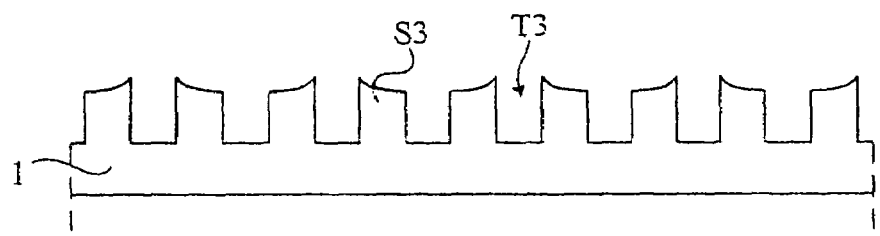
FIG. 10 shows the real shape of the narrow trenches obtained according to the method of FIGS. 1 to 9 the present invention.

As illustrated in FIG. 10, in practice, at the step described in relation with FIG. 9, it is not the perfectly regular square shape illustrated in FIG. 9 which is obtained, but rather an irregular shape such as illustrated in FIG. 10. The upper surface of ribs S3 is neither a horizontal plane, nor a planar surface, but may exhibit protruding edges. In the case, for example, where capacitors having a dielectric formed of a thin layer uniformly covering the entire surface of the structure of FIG. 10 are desired to be formed, such surface irregularities may pose problems. It is then provided to level the upper surface of ribs S3, for example, according to the method illustrated in relation with FIGS. 11 to 14.

Figure 11:
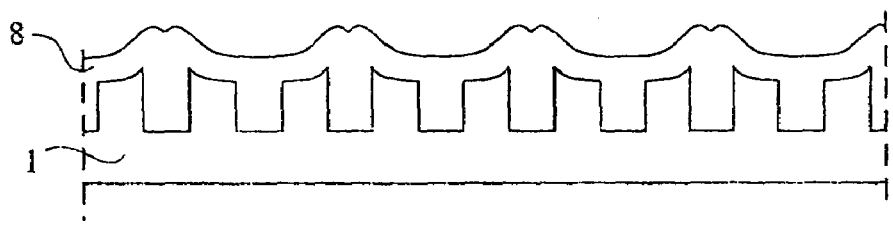
FIGS. 11 to 14 illustrate a specific embodiment of the last steps of a method according to an embodiment of the present invention.

In a preliminary step, illustrated in FIG. 11, an oxide layer 8 is deposited to totally fill narrow trenches T3 and cover ribs S3. The oxide thickness is in this example equal to 0.4 $\mu$m.

Figure 12:
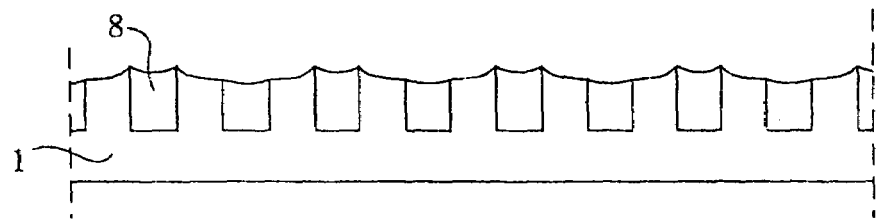

At the next step, illustrated in FIG. 12, a dry anisotropic etch of oxide 8 is performed to expose the upper portion of ribs S3 while keeping the oxide in narrow trenches T3.

As an alternative, oxide layer 8 may be replaced with a material that can be selectively etched with respect to the substrate.

Figure 13:
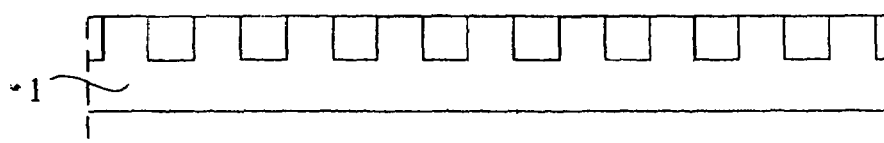
Figure 14:
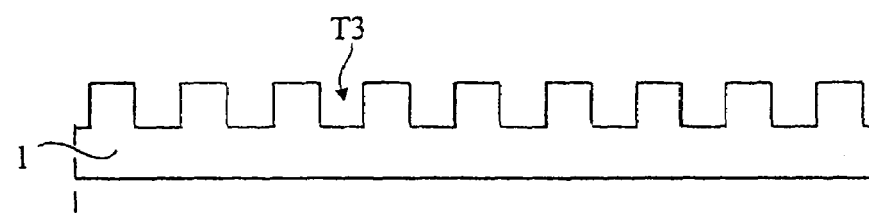

At the next step, illustrated in FIG. 13, a chemical-mechanical polishing is performed to level the upper portion of the structure.

At the final next step, illustrated in FIG. 13, oxide 8 is removed. Narrow trenches T3 separated with ribs S2 having a totally planar upper surface are then obtained.

Trenches formed according to the embodiments of the present invention depicted in FIGS. 1–14 may be utilized in a variety of integrated circuits, such as memory devices where the trenches may, for example, be utilized in forming capacitor structures. Such an integrated circuit may be contained in a variety of different types of electronic systems, such as a computer system.

Of course, the present invention is likely to have various alterations, modifications, and improvements which will readily occur to those skilled in the art. In particular, it will be within the abilities of those skilled in the art to define the oxide and polysilicon thicknesses as well as the duration of the etching thereof according to the width, the spading, and the depth of the desired narrow trenches.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for forming narrow trenches in a silicon substrate comprising the steps of:
    etching the substrate to form first trenches separated by first silicon ribs;
    performing a thermal oxidation of the substrate to form a silicon oxide layer developing inside and outside of the silicon, whereby second trenches narrower than the first trenches and second silicon ribs narrower than the first silicon ribs are obtained;
    filling the second trenches with fingers of an etchable material;
    etching the silicon oxide down to the upper surface of the second ribs while keeping silicon oxide portions between said etchable material fingers and the second ribs;
    etching away the second silicon ribs and said etchable material fingers;
    etching the silicon oxide for a duration sufficient to expose the substrate at the bottom of the silicon oxide portions, while leaving in place silicon oxide fingers; and
    anisotropically etching the substrate between the oxide fingers to form narrow trenches in the substrate.

2. The method of claim 1, wherein the filling step includes the two following steps:
    depositing a layer of an etchable material totally filling the second trenches and covering the silicon oxide layer, and etching said layer of an etchable material for a duration sufficient to leave in place only fingers in the second trenches.

3. The method of claim 1, wherein an additional step of etching back of said silicon oxide fingers is provided.

4. The method of claim 3, further comprising the steps of:
depositing a filling layer formed of a material selectively etchable with respect to the substrate, the filling layer totally filling the narrow trenches and covering the substrate ribs separating the narrow trenches;
etching the filling layer to expose the substrate ribs, while keeping the material present between ribs;
performing a chemical-mechanical polishing of the upper portion of the ribs; and
etching back the material remaining between the ribs.

5. The method of claim 1, wherein the width and the spacing of the first trenches are identical and the duration of the thermal oxidation of the substrate is provided to obtain substantially identical narrow trenches.

6. The method of claim 1, wherein the etchable material used to fill the second trenches is polysilicon.

7. The method of claim 1, wherein the second silicon ribs and the etchable material fingers are etched simultaneously.

8. A method of forming trenches in a substrate, comprising:
forming first trenches in the substrate, the first trenches having a first width and being defined by first projections from the substrate having a second width;
forming second trenches within the first trenches, the second trenches having a third width narrower than the first width;
reducing the width of the first projections to form second projections having a fourth width that is less than the second width;
forming fingers of removable material within the second trenches;
exposing the fingers and the second projections;
selectively removing the second projections to expose respective individual regions of the substrate;
selectively removing the fingers of removable material from the second trenches;
removing a bottom of the second trenches to expose respective individual regions of the substrate for each second trench; and
removing portions of the substrate from the exposed individual regions to form third trenches in the substrate, the third trenches having the third and fourth widths of the second trenches and second projections, respectively.

9. The method of claim 8 wherein the substrate comprises a silicon substrate.

10. The method of claim 8 wherein the operation of reducing occurs during the operation of forming the second trenches.

11. The method of claim 8 wherein the first and second widths are approximately equal and wherein the third and fourth widths are approximately equal.

12. The method of claim 8 wherein forming second trenches within the first trenches and reducing the width of the projections to a fourth width that is less than the second width comprises thermally oxidizing the substrate to form an oxidized layer in the first trenches and on the projections having the second width.

13. The method of claim 12 wherein forming a removable material within the second trenches comprises forming a removable material within the second trenches and on the oxidized layer.

14. The method of claim 8 wherein selectively removing the second projections and selectively removing the fingers occur simultaneously.

* * * * *